(12) United States Patent
Park et al.

(10) Patent No.: US 6,828,819 B2
(45) Date of Patent: Dec. 7, 2004

(54) HIGH-SPEED MEMORY SYSTEM

(75) Inventors: Myun-Joo Park, Incheon-shi (KR);
Byung-Se So, Seongnam-shi (KR);
Jae-Jun Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/353,924

(22) Filed: Jan. 30, 2003

(65) Prior Publication Data

US 2003/0161196 A1 Aug. 28, 2003

(30) Foreign Application Priority Data

Feb. 27, 2002 (KR) ................................ 10-2002-0010506

(51) Int. Cl.[7] .............................................. H03K 17/16
(52) U.S. Cl. ........................... 326/30; 326/86; 710/101
(58) Field of Search ............................. 326/30, 86, 83, 326/90; 710/100, 101, 128; 711/105, 162, 101, 104, 115, 116, 170; 365/51, 52, 63, 200, 230.03, 233

(56) References Cited

U.S. PATENT DOCUMENTS

| | | | | |
|---|---|---|---|---|
| 6,026,456 A | * | 2/2000 | Ilkbahar | 710/100 |
| 6,122,695 A | * | 9/2000 | Cronin | 710/100 |
| 6,172,895 B1 | | 1/2001 | Brown et al. | |
| 6,229,335 B1 | * | 5/2001 | Huang et al. | 326/30 |
| 6,249,142 B1 | * | 6/2001 | Hall et al. | 326/30 |
| 6,522,165 B2 | * | 2/2003 | Ramachandran et al. | 326/30 |
| 6,631,083 B2 | * | 10/2003 | McCall et al. | 365/51 |
| 2003/0099138 A1 | * | 5/2003 | Kyung | 365/200 |

* cited by examiner

*Primary Examiner*—Michael Tokar
*Assistant Examiner*—Linh Van Nguyen
(74) *Attorney, Agent, or Firm*—Harness Dickey

(57) ABSTRACT

A memory system includes a chipset mounted on a circuit board, and first and second memory module connectors mounted respectively on the circuit board. The first and second memory modules are inserted into the first and second memory module connectors, respectively. The memory system further includes a bus connected to the chipset and the first and second memory module connectors so to create a branch point. Each of the first and second memory modules includes at least one memory device connected to the bus via a stub line and a stub resistor. Impedance of the bus is less than that of the stub line.

26 Claims, 14 Drawing Sheets

HIGH-SPEED MEMORY SYSTEM

This application claims priority of Korean Patent Application No. 2002-10506, filed on Feb. 27, 2002, the contents of which are herein incorporated by reference in their entirety.

FIELD OF THE INVENTION

The present invention generally relates to memory systems, and in particular, to two-slot memory bus systems having two slots into which individual memory modules may be inserted.

BACKGROUND OF THE INVENTION

It is desirable to reduce high-frequency noise generated in connection with a high-speed operation, thereby reducing a decrease in signal fidelity. Recently, various high-speed bus systems have been adopted to reduce the high-frequency noise of bus channels.

Generally, as an operation speed of a memory bus increases, high-frequency reflection noise increases. This is caused by various kinds of discontinuous points on a bus channel. To prevent or suppress this noise, techniques for improving an impedance matching characteristic of an entire bus channel have been proposed. For example, the impedance matching characteristic of the entire bus channel can be improved by inserting a passive element (e.g., a resistor) into an intermediate or end portion of a bus channel.

A conventional memory bus system adopting a stub series transceiver logic (SSTL) is illustrated in FIG. 1. Referring to FIG. 1, a memory system 10 of the SSTL type has two memory module connectors (or sockets) 12 and 14 into which corresponding memory modules 16 and 18 are inserted, respectively. The memory module connectors 12 and 14 are coupled with a bus 22 that is disposed on a circuit board 20, which is also commonly referred to as a motherboard. A chipset (or a memory controller) 24 is connected to the first end of the bus 22, and a termination circuit 26 is connected to the second end thereof. The termination circuit 26 is formed of a termination resistor RT connected to a termination voltage VT. Each of the memory modules 16 and 18 has a memory device 28 that is connected to the bus 22 via a stub resistor RSTUB and a stub line LSTUB. As illustrated in FIG. 1, the memory system 10 adopting the SSTL manner includes a series resistor RSERIES that is connected in series with the bus 22.

With the conventional memory system in FIG. 1, the first end of the bus 22 to which the chipset 24 is connected is in an open state (or non-terminated). Likewise, a stub line LSTUB connected to a memory device of a memory module is in an open state instead of a terminated state. This design of the conventional memory circuit induces reflected waves, which result in limiting a high-speed operation characteristic of the memory circuit. At least some of the reflected waves are generated at branch points (or discontinuous points) inherent in the conventional memory system.

SUMMARY OF THE INVENTION

An exemplary embodiment of the present invention provides a two-slot memory system capable an efficient high-speed operation.

An exemplary embodiment of the present invention provides a straightforwardly constructed two-slot memory system.

An exemplary embodiment of the present invention provides a memory system, including a circuit board, a chipset mounted on the circuit board, a plurality of memory module connectors mounted on the circuit board, a plurality of memory modules, each of the plurality of memory modules individually receivable in each of the plurality of memory module connectors, and a bus connected to the chipset and the plurality of memory module connectors. The plurality of memory module connectors are connected to the bus at one branch point thereof. Each of the plurality of memory modules includes at least one memory device connected to the bus via a stub line and a stub resistor, and an impedance of the bus is less than that of the stub lines.

Furthermore, an exemplary embodiment of the present invention provides a memory system, including a chipset having a transceiver and a termination circuit commonly connected to a bus, a plurality of memory module connectors commonly connected to the bus, a memory module insertable into one of the plurality of memory module connectors and having a transceiver and a termination circuit commonly connected to the bus via a stub line and a stub resistor, and another memory module insertable into one of the plurality of memory module connectors and having a transceiver and a termination circuit commonly connected to the bus via another stub line and another stub resistor. An impedance of the bus is less than that of each of the stub lines, and the stub resistors have half the impedance of each of the stub lines.

Moreover, an exemplary embodiment of the present invention provides a circuit associated with a memory system, including a bus line having an impedance value, and at least one stub line connected to the bus line, the at least one stub line having an impedance value greater than the impedance value of the bus line.

Furthermore, an exemplary embodiment of the present invention provides a memory system, including a bus line, a chipset operationally connected to the bus line, and at least one memory module operationally connected to the bus line, the at least one memory module including a termination circuit.

Further scope of applicability of the present invention will become apparent from the detailed description given hereinafter. However, it should be understood that the detailed description and specific examples, while indicating exemplary embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF EXEMPLARY EMBODIMENTS

Figure 2:
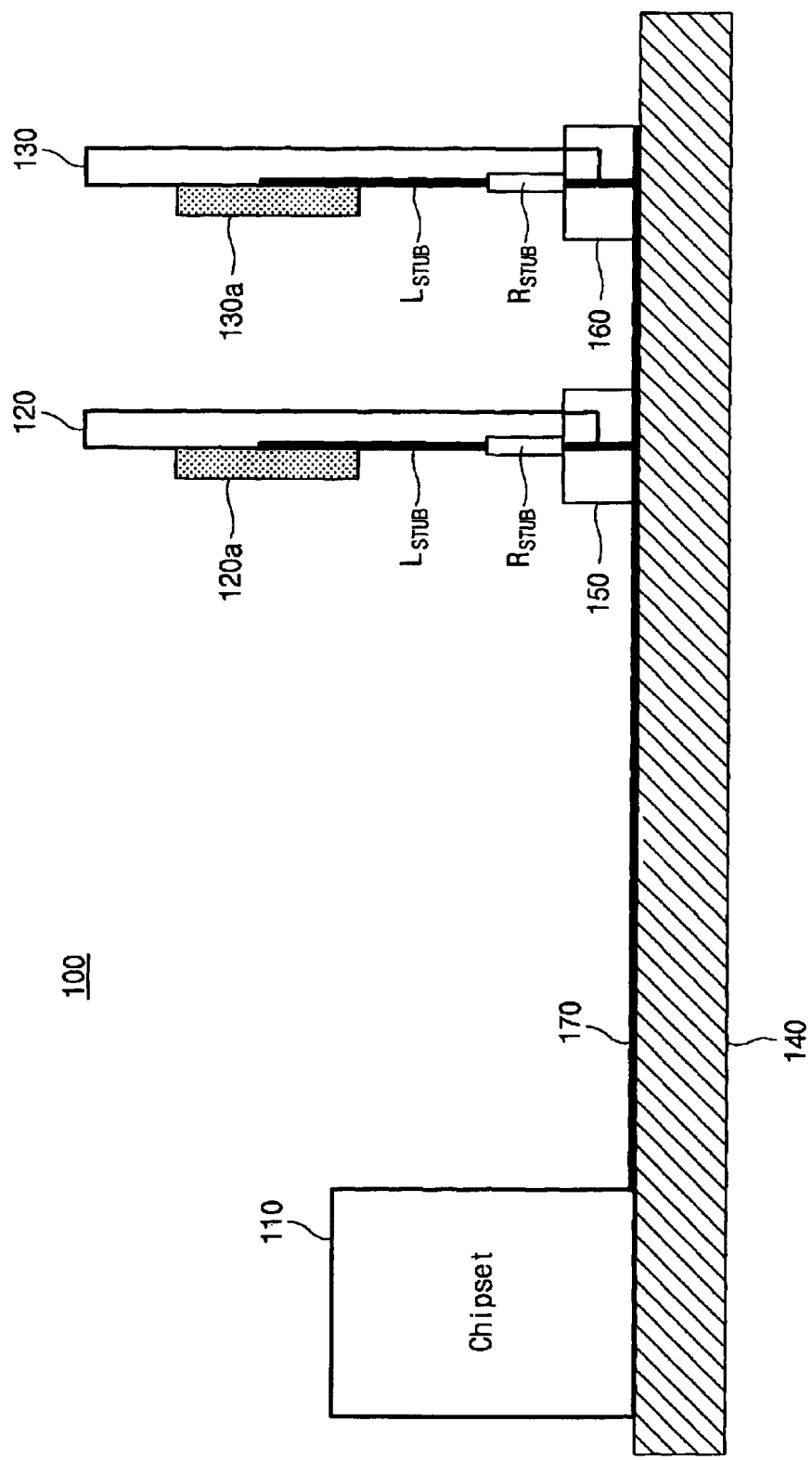
FIG. 2 is a schematic diagram of a memory system according to an exemplary embodiment of the present invention.
Figure 3:
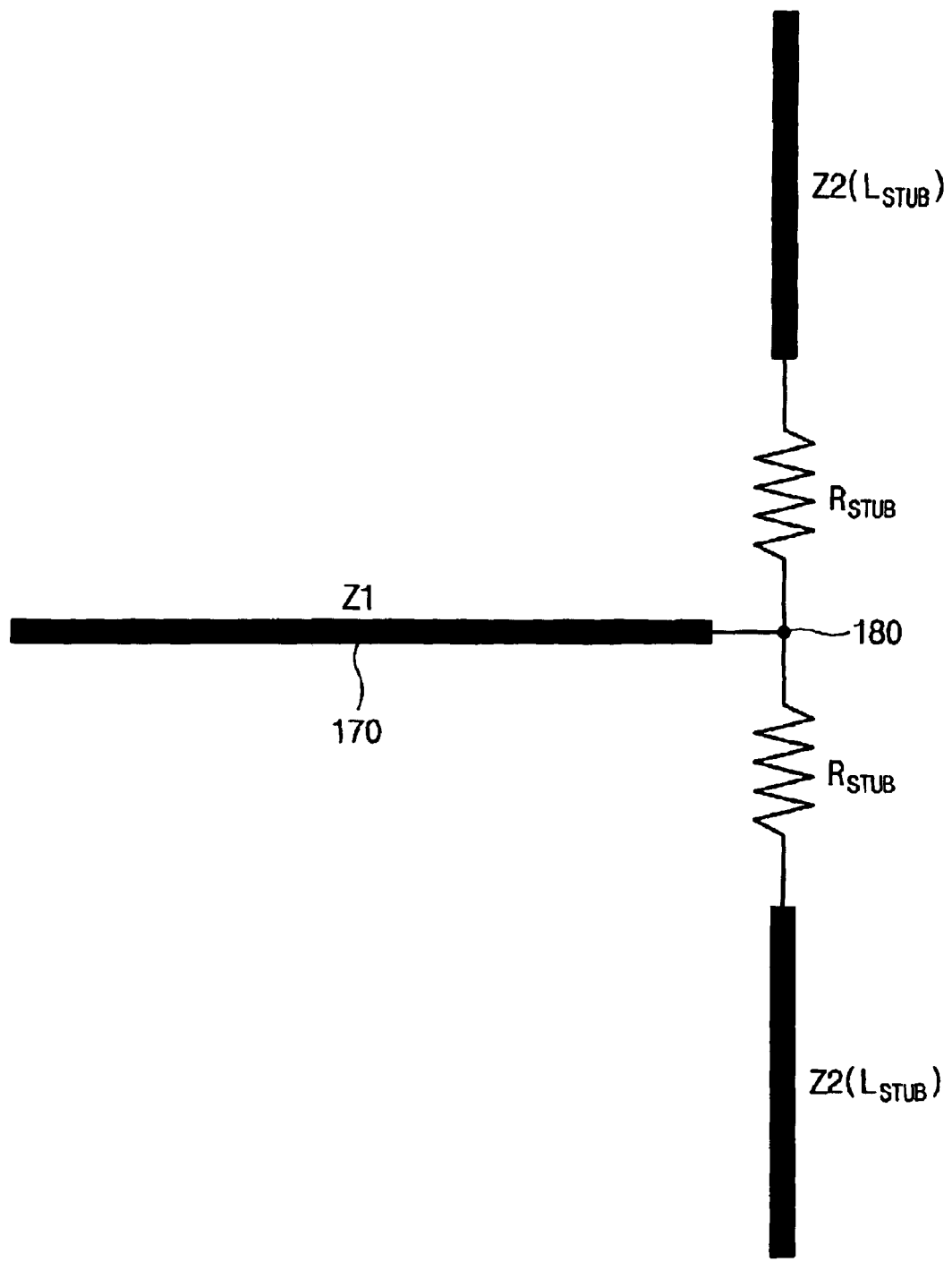
FIG. 3 is a diagram for describing impedance conditions of a bus, stub lines, and stub resistors illustrated in FIG. 2.
Figure 4:
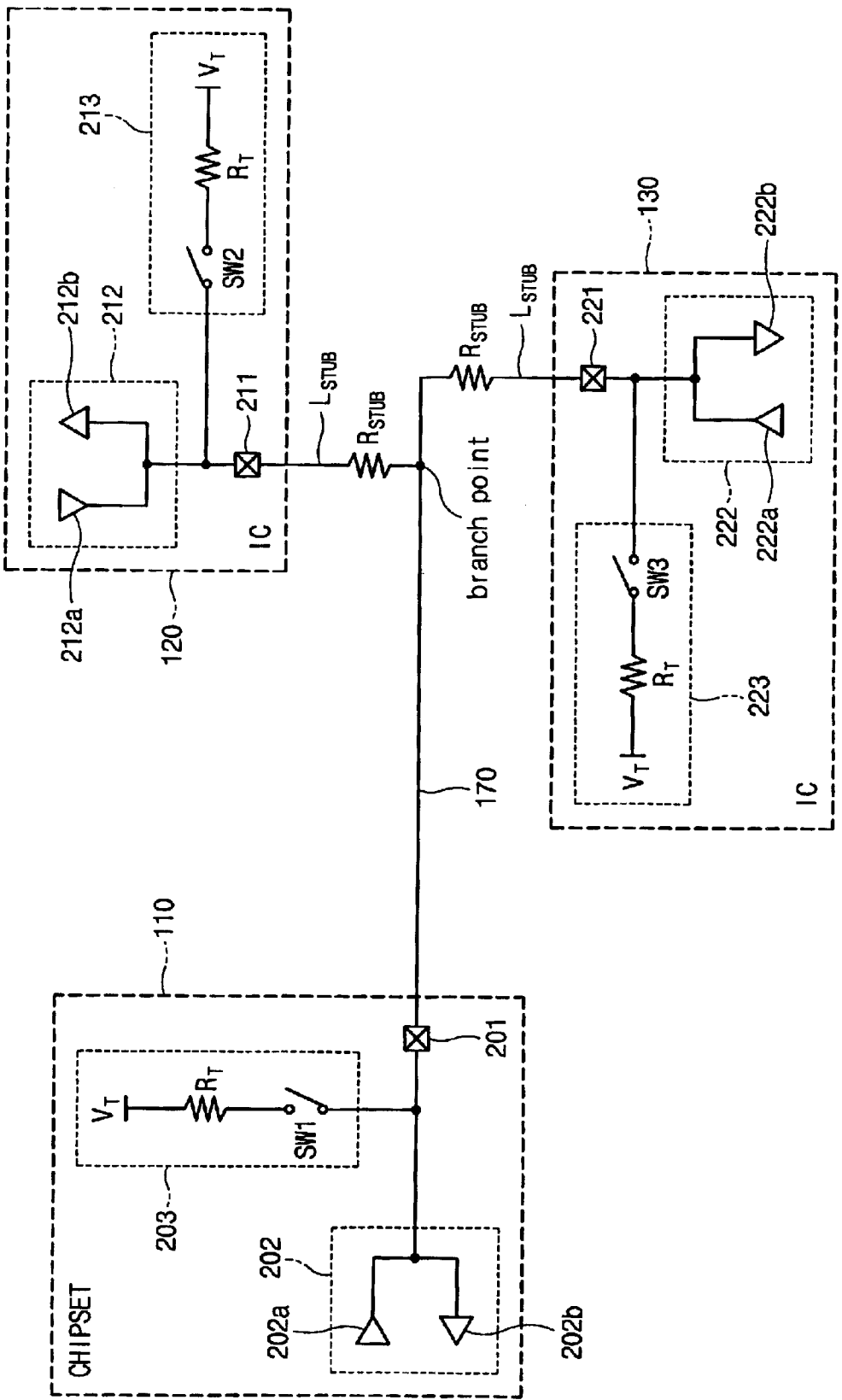
FIG. 4 is a schematic diagram of a chipset and memory modules each of which include a termination circuit according to an exemplary embodiment of the present invention.

Exemplary embodiments of the present invention will be more fully described with reference to the attached drawings. FIG. 2 is a schematic diagram of a memory system according to an exemplary embodiment of the present invention. FIG. 3 is a diagram for describing impedance conditions of a bus, stub lines, and stub resistors illustrated in FIG. 2. FIG. 4 is a schematic diagram of a chipset and memory modules each of which include a termination circuit according to an exemplary embodiment of the present invention.

To begin with, referring to FIG. 2, a memory system 100 includes a chipset 110, the first memory module 120, and the second memory module 130. As a memory controller, the chipset 110 is mounted on a circuit board 140, which may also be referred to as a motherboard. Memory module connectors 150 and 160 are mounted on the circuit board 140, and the first and second memory modules 120 and 130 are inserted into the memory module connectors 150 and 160, respectively. The chipset 110 is connected to the first end of the memory bus 170.

Although the exemplary embodiment is illustrated as including a first memory module 120 and a second memory module 130, the exemplary embodiments of the present invention are not limited to circuit boards/motherboards capable of handling only two memory modules. Instead, the present invention is also applicable to those circuit boards that handle memory modules greater than two, and those circuit boards designed to handle only one memory module.

Each of the first and second memory modules 120 and 130 has a plurality of memory devices (or memory chips), which are mounted on a corresponding memory module so as to construct a SIMM (single in-line memory module) or a DIMM (double in-line memory module). In the illustrated exemplary embodiment, memory devices are mounted on a corresponding memory module so as to construct SIMM. However, memory devices may also be mounted on a corresponding module so as to construct a DIMM. A memory device 120a of the first memory module 120 is connected to the memory bus 170 via a stub line LSTUB and a stub resistor RSTUB. Likewise, a memory device 130a of the second memory module 130 is connected to the memory bus 170 via a stub line LSTUB and a stub resistor RSTUB.

Figure 1:
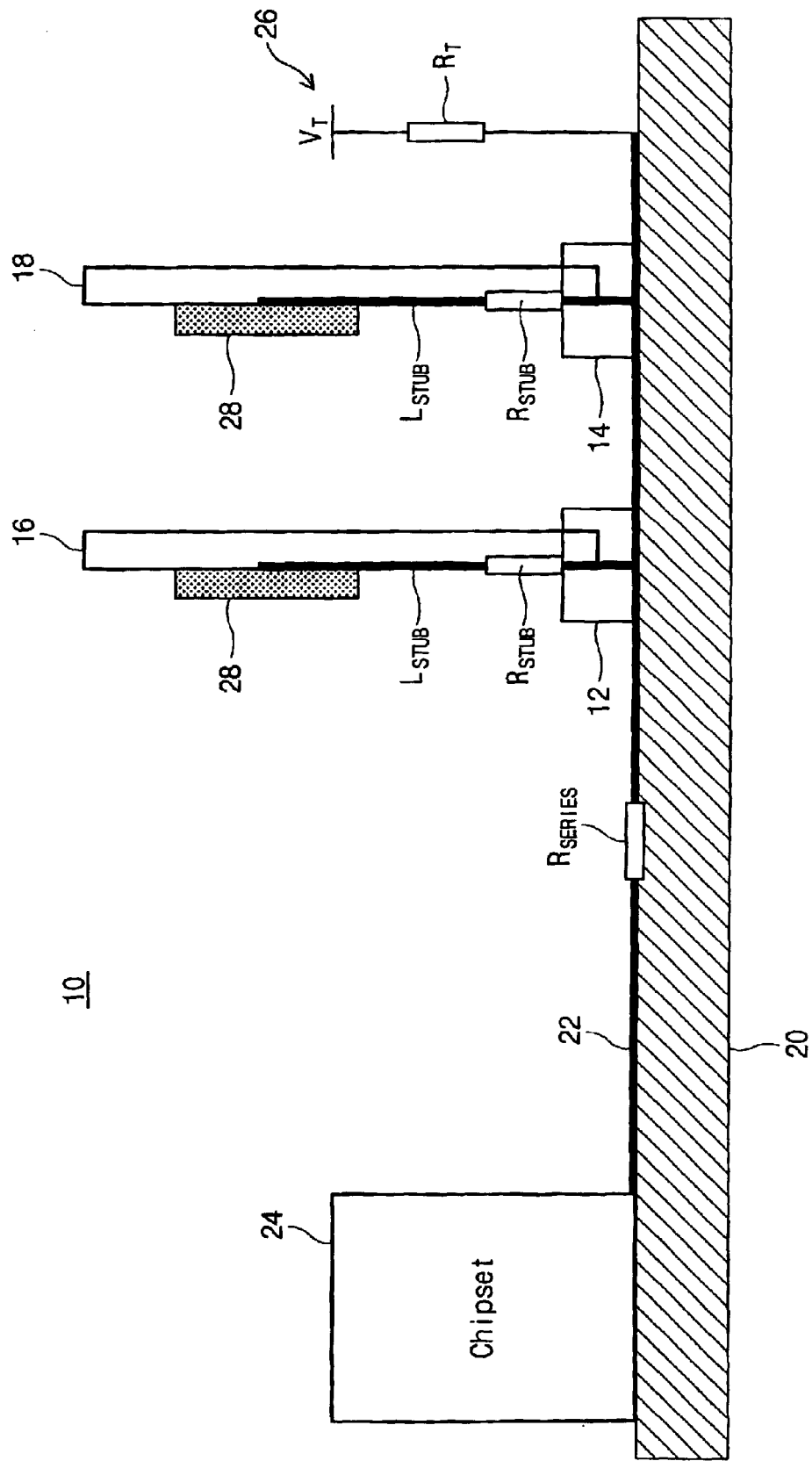
FIG. 1 is a schematic diagram of a conventional memory system adopting a signal transmission manner of SSTL.

As understood in FIG. 2, a series resistor RSERIES and a termination circuit 26 (see FIG. 1) are not used on the memory bus 170. Therefore, the memory bus 170 according to an exemplary embodiment memory is simplified due to the absence of a series resistor connected in series with the memory bus 170. The memory bus 170 is simplified further since a termination voltage and a resistor forming the termination circuit are not required. Moreover, because a termination voltage is not used, circuits for generating and dividing the termination voltage are unnecessary. Generally, the exemplary embodiments of the present invention benefit from reduced manufacturing costs as compared to the manufacturing costs associated with conventional memory systems.

In the memory system according to an exemplary embodiment of the present invention, as illustrated in FIG. 3, a memory bus 170 may have one branch point (or a discontinuous point) 180, to which the first and second memory modules 120 and 130 are connected via corresponding memory module connectors. In FIG. 3, a stub line LSTUB is connected to a branch point 180 of the memory bus 170 through a stub resistor RSTUB that is formed on the first memory module 120. Likewise, a stub line LSTUB is connected to the branch point 180 of the memory bus 170 through a stub resistor RSTUB that is formed on the second memory module 130. An impedance Z1 of the memory bus 170 is designed less than an impedance Z2 of the stub line LSTUB and aan impedance Z2 of the stub line LSTUB in the first and second memory modules 120 and 130, respectively. In this exemplary embodiment, the impedances Z2 of the stub line LSTUB and the stub lines LSTUB are substantially the same impedance. For example, a ratio of the impedance Z1 to the impedances Z2 is 3:4, and the stub resistor RSTUB of each memory module has a value of $$\frac{Z2}{2}.$$

Referring again to FIG. 2, the chipset 110 and the first and second memory modules 120 and 130 include corresponding termination circuits so as to terminate the memory bus 170. Termination circuits included in the chipset 110 and the first and second memory modules 120 and 130 are designed so as to be operated selectively according to a mode of operation. This will be fully described below.

Referring to FIG. 4, the memory bus 170 is formed of only one bus line. However, it is understood that the memory bus 170 may be formed of more bus lines. The chipset 110 includes a transceiver 202 and a termination circuit 203 that are connected in common to a pad 201. The pad 201 is connected to one end of the memory bus 170. The transceiver 202 is formed of a driver 202a as a transmitter and a receiver 202b. The termination circuit 203 includes a termination resistor RT and a switch SW1 that are connected in series between a termination voltage VT and the pad 201. The first memory module 120 includes a transceiver 212 and a termination circuit 213 that are connected in common to a pad 211. The pad 211 is connected to the other end of the memory bus 170, that is, a branch point thereof. The transceiver 212 includes a driver 212a and a receiver 212b. The termination circuit 213 includes a termination resistor RT and a switch SW2 that are connected in series between a termination voltage VT and the pad 211. The second memory module 130 includes a transceiver 222 and a termination circuit 223 that are connected in common to a pad 221. The pad 221 is connected to the other end of the memory bus 170, that is, the branch point thereof. The transceiver 222 includes a driver 222a and a receiver 222b. The termination circuit 223 includes a termination resistor RT and a switch SW3 that are connected in series between a termination voltage VT and the pad 221.

It should be understood that the circuitry illustrated in FIG. 4 is merely one example of implementing an exemplary embodiment of the present invention. For example, although transceivers are used in FIG. 4, separate transmitters and receivers may also be used if available circuitry and design parameters dictate such component use. Similar substitutes for other circuits described herein are also possible, and such are unquestionably within the purview of the exemplary embodiments of the present invention.

In an exemplary embodiment of the present invention, termination circuits 203, 213, and 223, each included in the chipset 110 and the first and second memory modules 120 and 130, are controlled so as to operate selectively according to a mode of operation. Although not shown in figures, a circuit for controlling a termination circuit in a chipset/module according to the mode of operation is individually implemented in the chipset/module. For example, in a case where data read out from a memory module is transmitted to a chipset, switches SW2 and SW3 are selectively switched off and a switch SW1 is switched on. In a case where data to be written in a memory module is transmitted from a chipset, the switches SW2 and SW3 are selectively switched on and the switch SW1 is switched off. This will be more fully described below.

FIGS. 5A to 5E illustrate diagrams for showing operational states of termination circuits in memory modules in accordance with a write operation.

When a write operation is carried out, termination circuits 213 and 223 of the first and second memory modules 120 and 130 inserted in corresponding memory module connectors 150 and 160 are used as a termination resistor. For example, referring to FIG. 5A, switches SW2 and SW3 of the termination circuits 213 and 223 are turned on, so that termination resistors RT of the first and second memory modules 120 and 130 are connected to a memory bus 170, respectively. When the write operation is carried out, either one of the termination circuits 213 and 223 in memory modules 120 and 130 is used as a termination resistor. For example, as illustrated in FIG. 5B, the switch SW2 of the termination circuit 213 in a memory device 120a mounted on the first memory module 120 is turned on, so that the termination resistor RT is connected to the memory bus 170. At this time, the termination circuit 223 of a memory device 130a mounted on the second memory module 130 does not operate. On the other hand, as illustrated in FIG. 5C, the switch SW3 of the termination circuit 223 in a memory device 130a mounted on the second memory module 130 is turned on, so that the termination resistor RT is connected to the memory bus 170. At this time, the termination circuit 213 of the memory device 120a mounted on the first memory module 120 does not operate. In the case that a memory module 120 or 130 is inserted into either one of memory module connectors, as illustrated in FIGS. 5D and 5E, a termination circuit 213/223 of a memory device 120a/130a mounted on the inserted memory module 120/130 operates as a termination resistor.

FIGS. 6A to 6F are diagrams for showing operation states of termination circuits in memory modules and a chipset in accordance with a read operation.

Figure 6A:
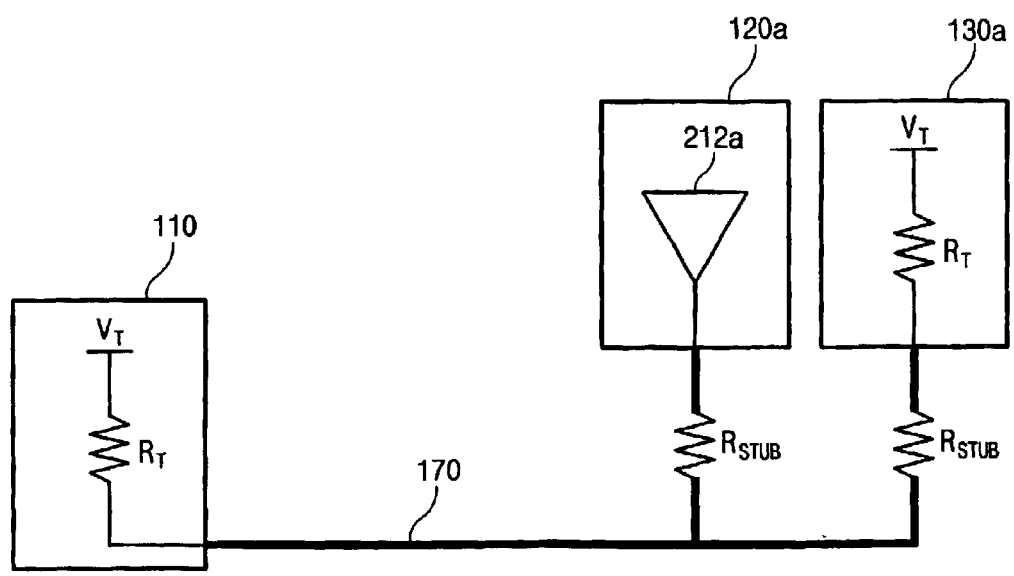
FIGS. 6A to 6F are diagrams for showing operation states of termination circuits in memory modules and a chipset in accordance with a read operation.
Figure 6B:
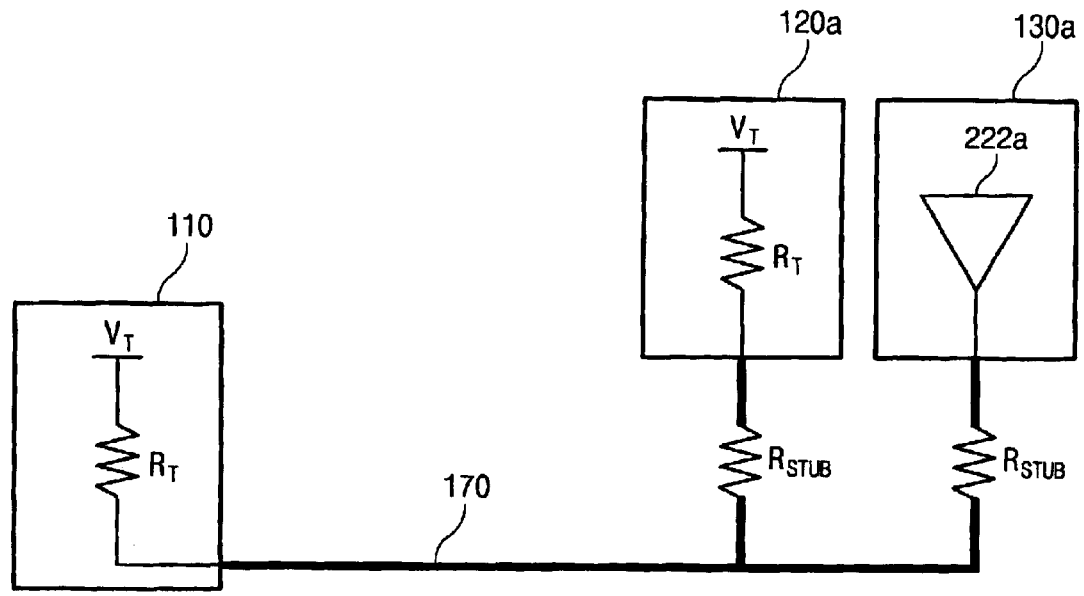
Figure 6C:
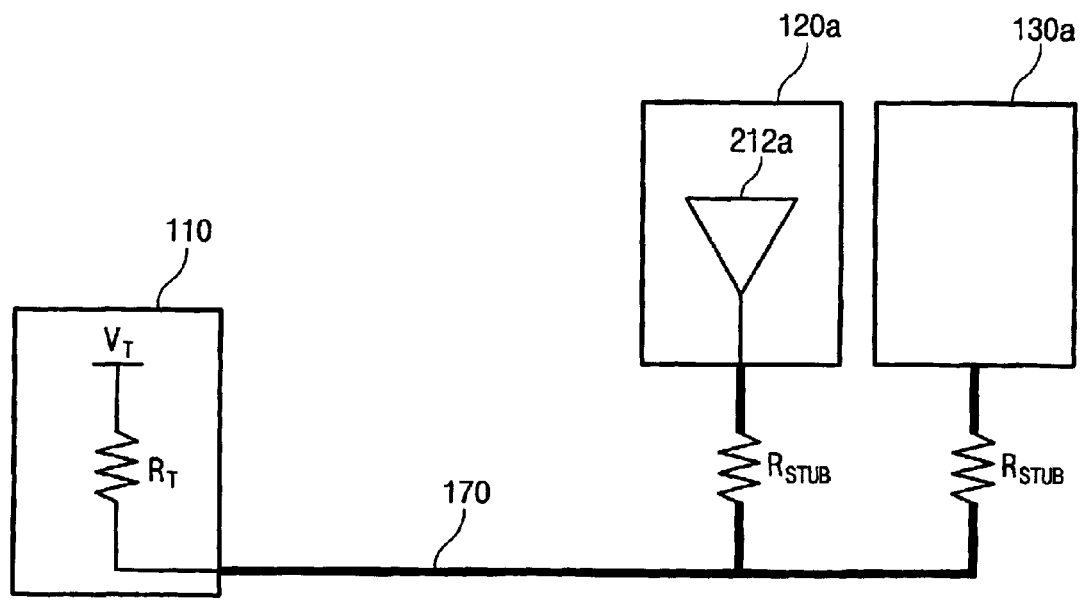
Figure 6D:
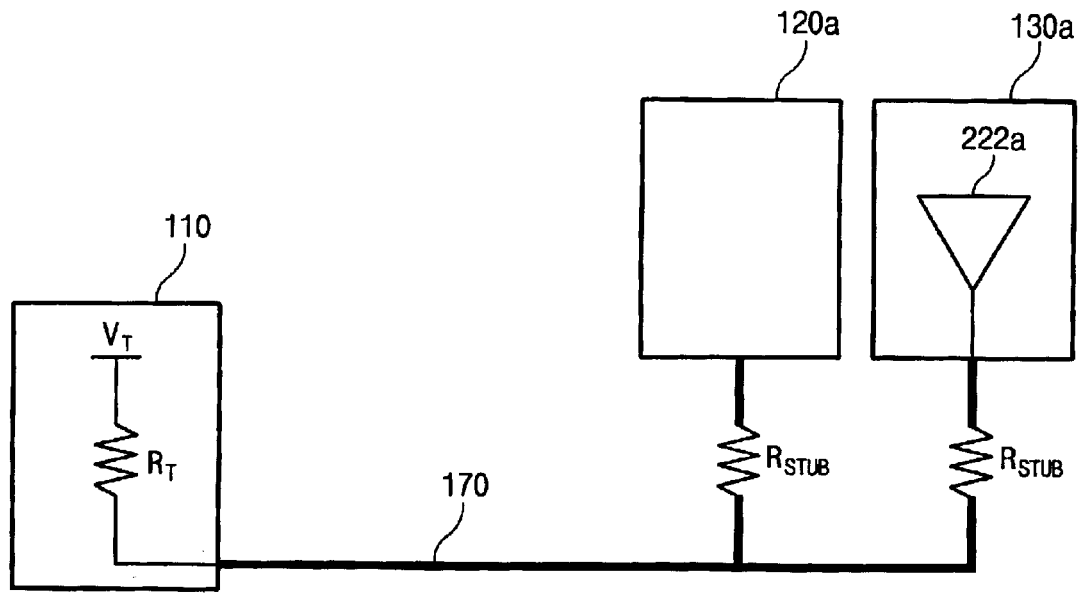
Figure 6E:
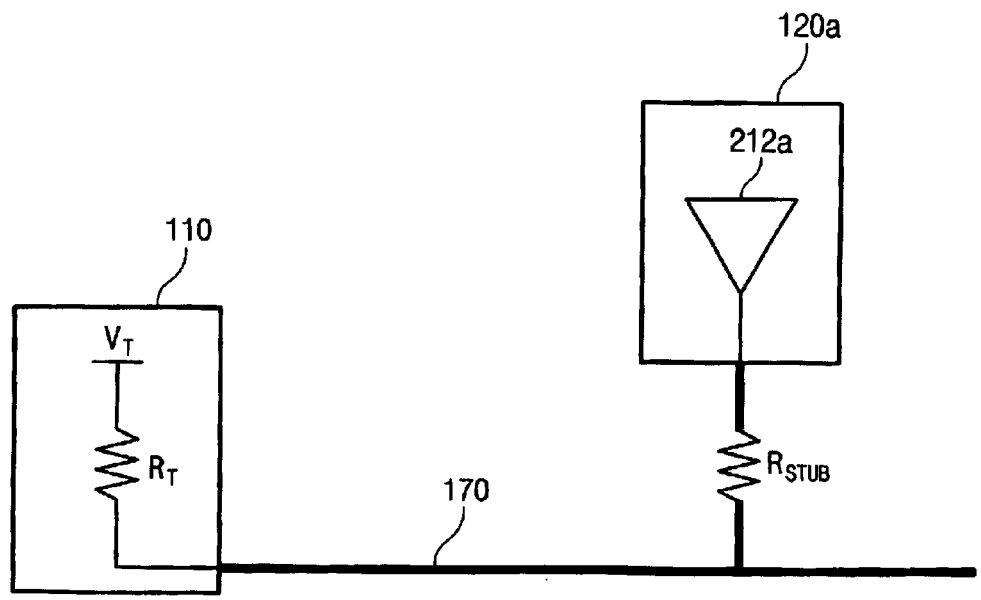
Figure 6F:
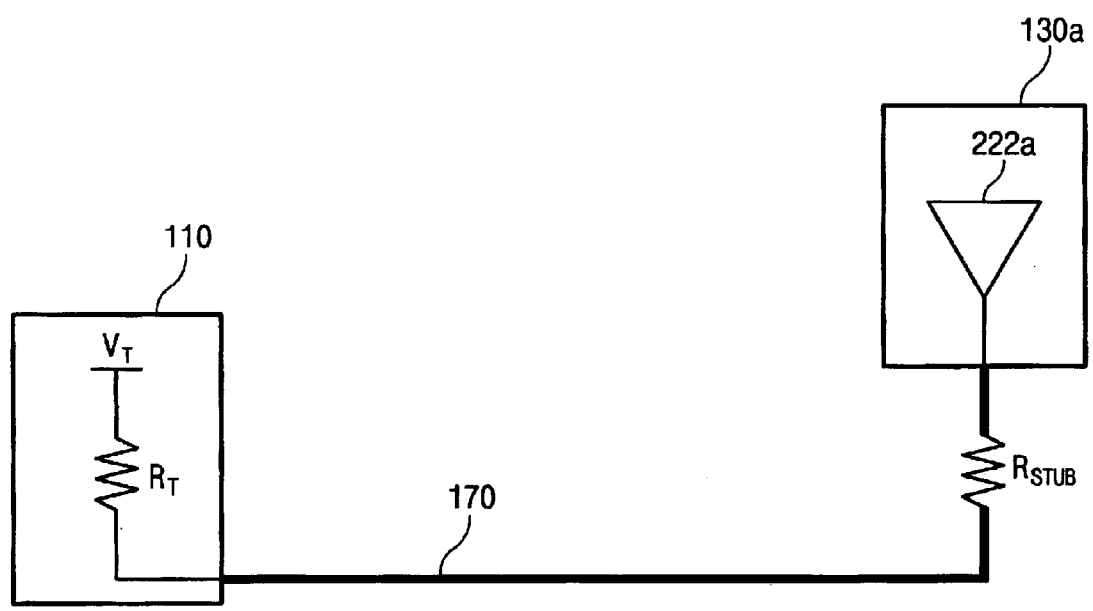

In a case where memory modules 120 and 130 are inserted in corresponding memory module connectors 150 and 160, respectively, either one of the memory modules 120 and 130 will be selected at a read operation. When a read operation is carried out, a switch SW1 of a termination circuit 203 in a chipset 110 is turned on, so that one end of a memory bus 170 is terminated. While a termination circuit of a selected memory module does not operate, a termination circuit of an unselected memory module operates. For example, as illustrated in FIG. 6A, when a memory device 120a on the first memory module 120 is selected a termination circuit 223 of a memory device 130a on the second memory module 130 operates as a termination resistor. On the other hand, as illustrated in FIG. 6B, when the memory device 130a on the second memory module 130 is selected a termination circuit 213 of the memory device 120a on the first memory module 120 operates as a termination resistor. Alternatively, as illustrated in FIGS. 6C and 6D, a termination circuit of an unselected memory module does not operate. In the case that a memory module is inserted into either one of the memory module connectors, a termination circuit 213/223 of a memory device 120a/130a on the inserted memory module does not operate, as illustrated in FIGS. 6E and 6F.

Simulation results of a memory system adopting a memory bus structure according to an exemplary embodiment of the present invention are illustrated in FIGS. 7A–7D and 8A–8D. The various impedance and resistance values provided are by way of example only.

Waveforms illustrated in FIGS. 7A to 7D are obtained under the conditions that a channel date transfer rate is 533 Mbps, that impedance Z1 of a memory bus 170 is 39Ω, that impedance Z2 of each stub line LSTUB is 52Ω, and that a resistance value of each stub resistor RSTUB is 20Ω. Amplitude diminishment reduction of a channel signal may be achieved by making a value of the stub resistor RSTUB a little less than a value $$\left(\frac{Z2}{2} = 26 \; \Omega\right)$$

determined by a perfect matching condition at a branch point 180. A termination resistor RT of 75Ω is used at each memory device on a memory module, and a termination resistor RT of 150Ω is used at a chipset 110. There is obtained an effect of magnifying a voltage amplitude of a channel signal by using a termination resistor whose resistance value is a little larger than impedance of a memory bus.

Figure 7A:
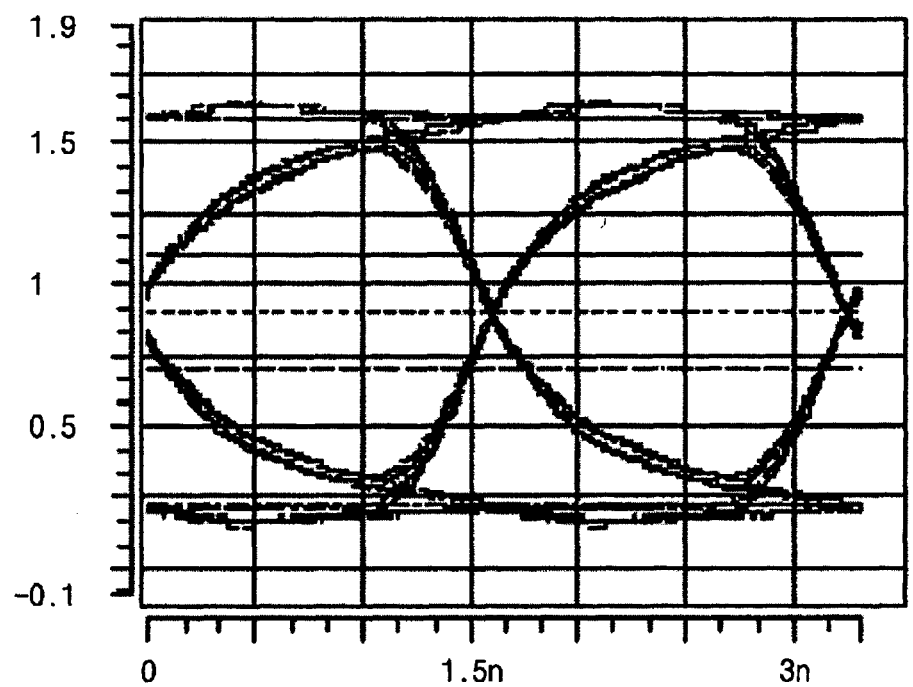
FIGS. 7A to 7D are eye waveform diagrams of data that is transmitted from a memory system according to an exemplary embodiment of the present invention.
Figure 7B:
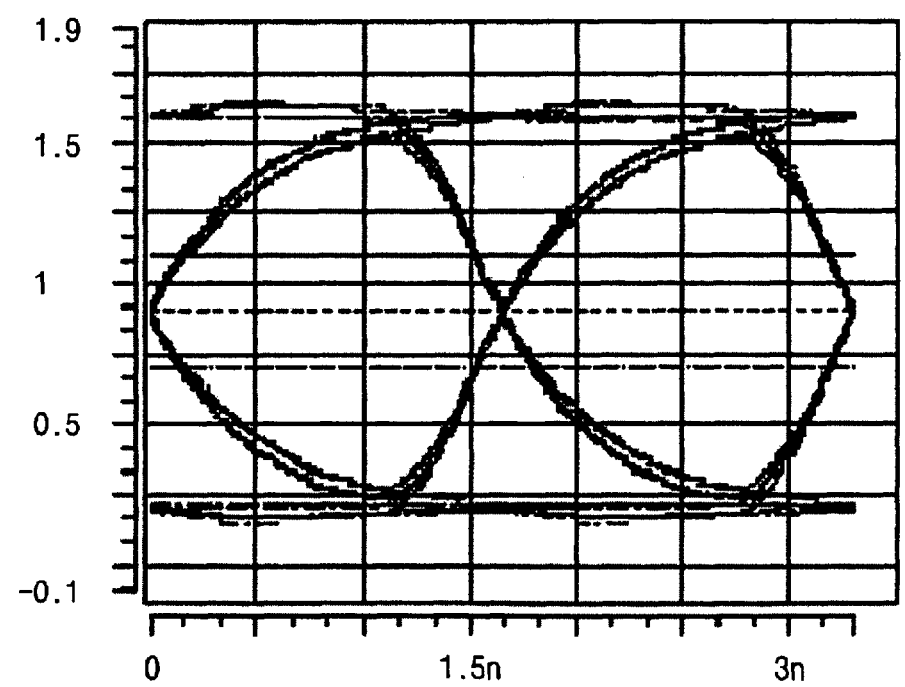
Figure 7C:
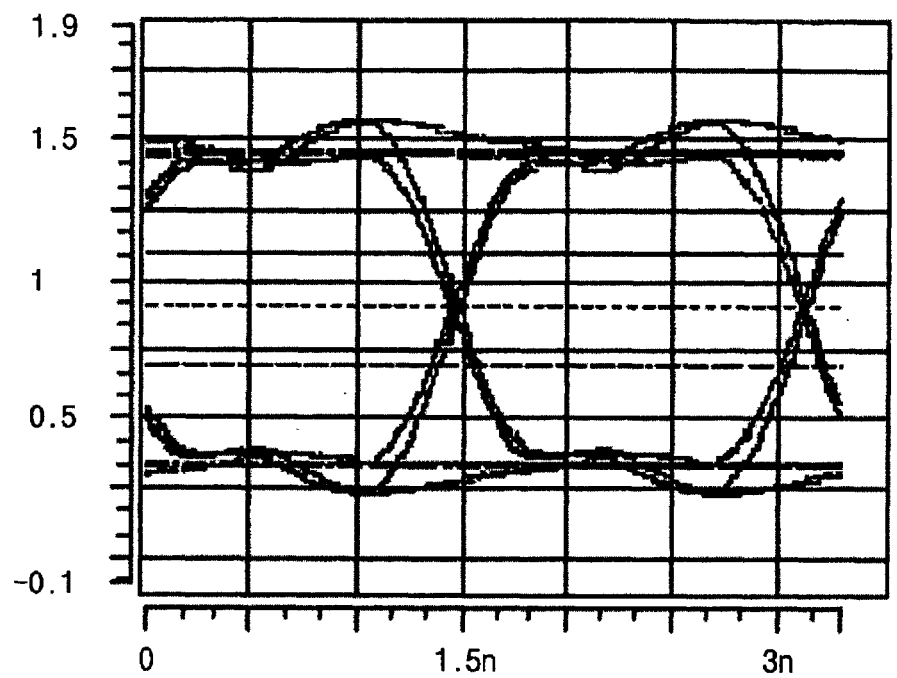
Figure 7D:
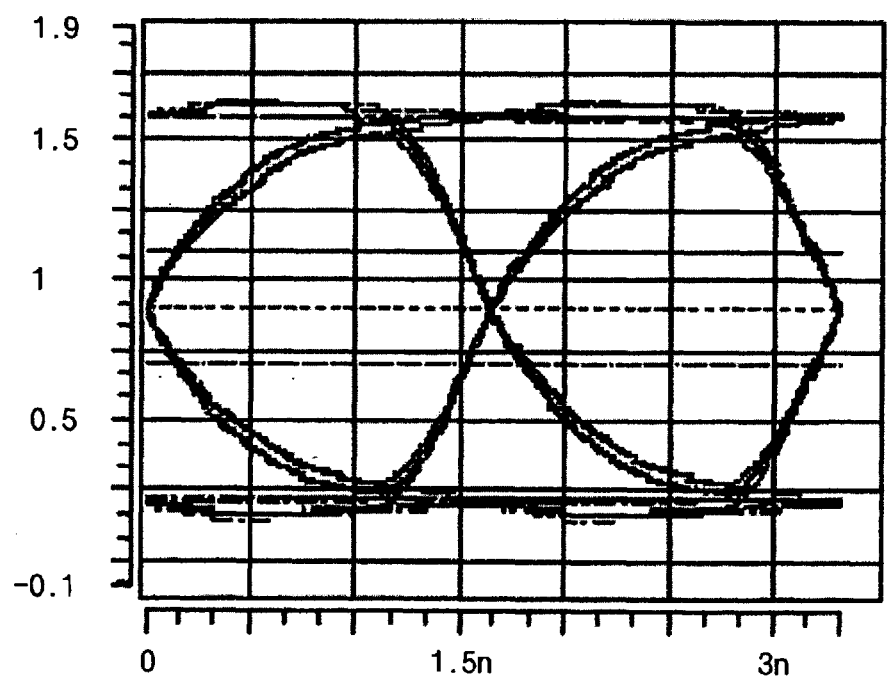

In FIGS. 7A and 7B, waveforms are taken using a memory system similar to that illustrated in FIG. 5B or 5C and that satisfies the aforementioned conditions. Therefore, when data is written in the first memory module 120 a termination circuit of the second memory module operates, and when data is written in the second memory module 130 a termination circuit of the first memory module 120 operates. Waveforms illustrated in FIGS. 7C and 7D are taken using a memory system similar to that illustrated in FIG. 6C or 6D. Accordingly, a termination circuit 203 of a chipset 110 is activated, and termination circuits 213 and 223 of memory devices on memory modules which are inserted into corresponding memory module connectors respectively are disabled.

In an exemplary embodiment of the present invention, a memory system is designed such that a channel signal voltage is magnified under a low signal driving voltage condition. Therefore minimal channel mismatching occurs as a result of a manner in which the termination circuits are controlled and a resistance value of a stub or termination resistor. Nevertheless, the memory systems according to the exemplary embodiments of the present invention provide excellent signal data waveforms at a relatively high operation speed.

In FIGS. 8A to 8D, waveforms are obtained under the conditions that a channel date transfer rate is 800 Mbps, an impedance Z1 of a memory bus 170 is 47Ω, an impedance Z2 of each stub line LSTUB is 63Ω, and a resistance value of each stub resistor RSTUB is 31.5Ω. A termination resistor RT of 63Ω is in each memory device on a memory module, and a termination resistor RT of 47Ω is used in a chipset 110.

Figure 5A:
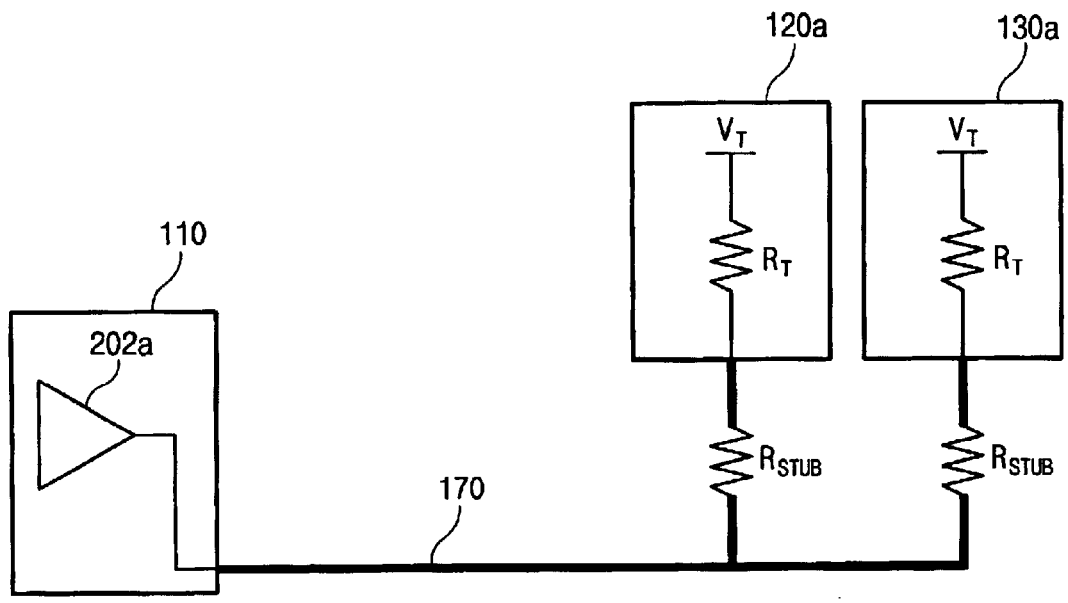
FIGS. 5A to 5E are diagrams for showing operation states of termination circuits in memory modules in accordance with a write operation.
Figure 5B:
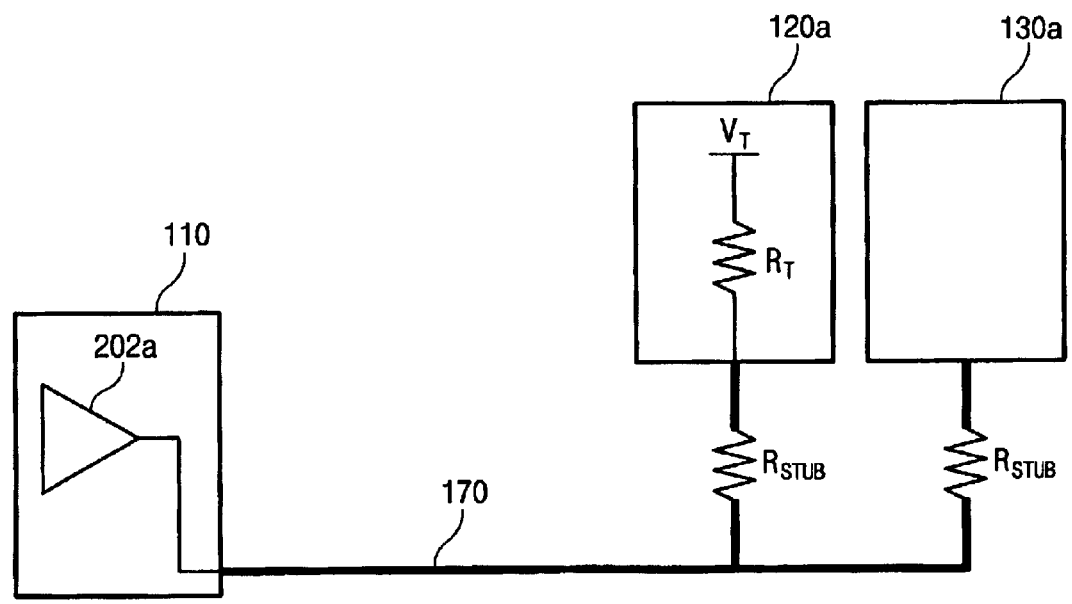
Figure 5C:
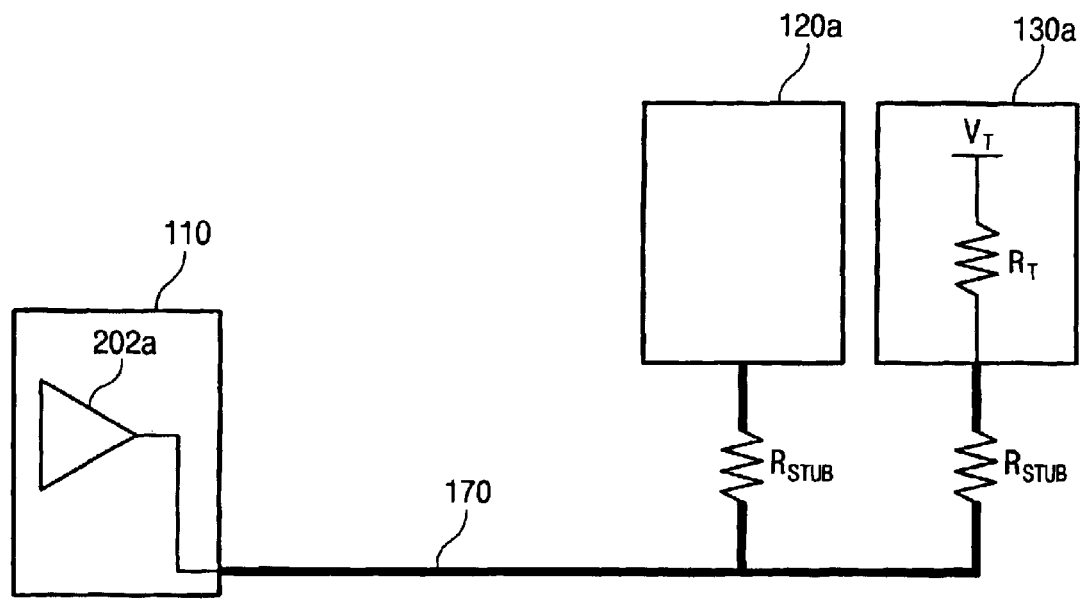
Figure 5D:
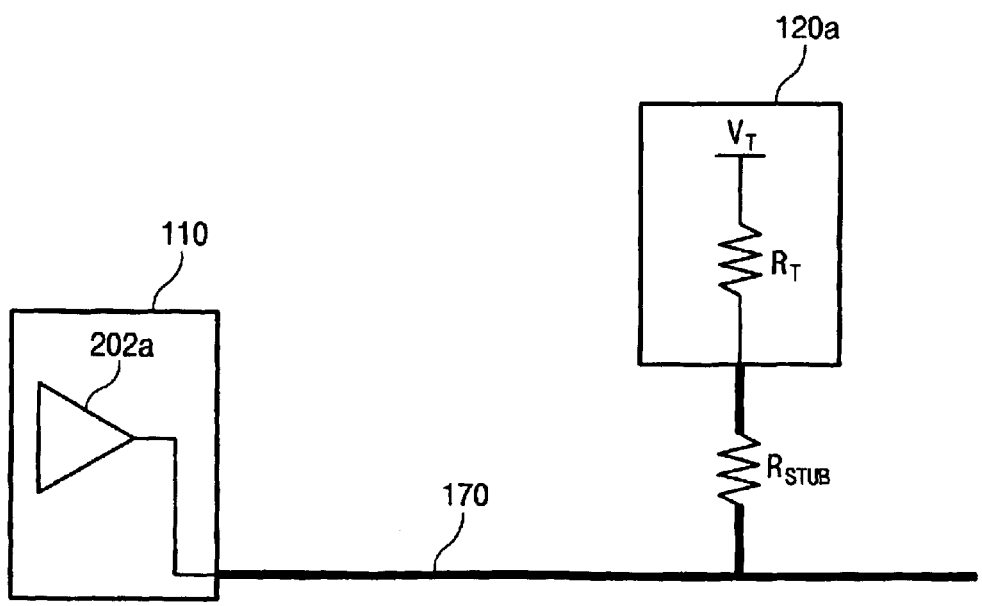
Figure 5E:
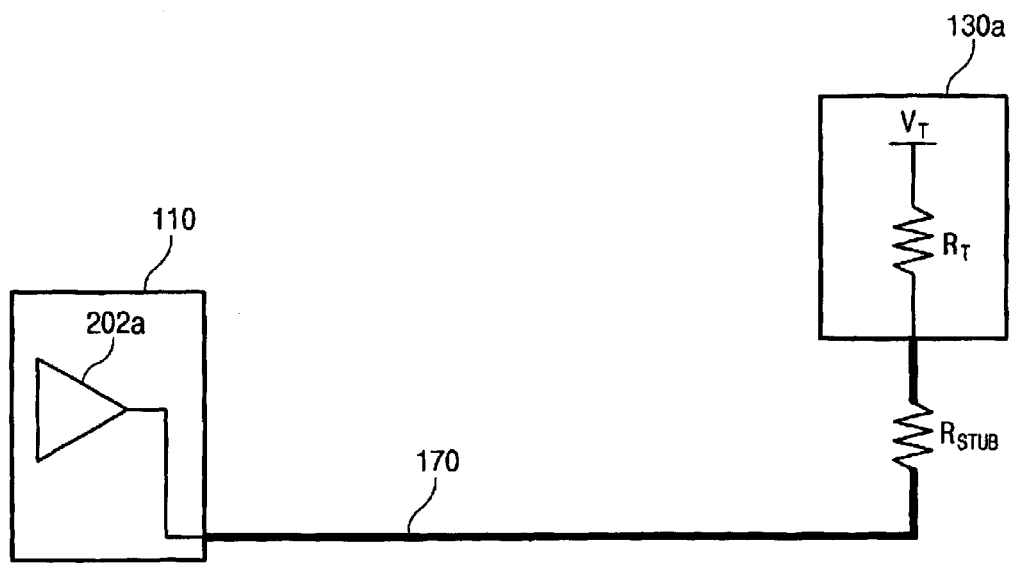
Figure 8A:
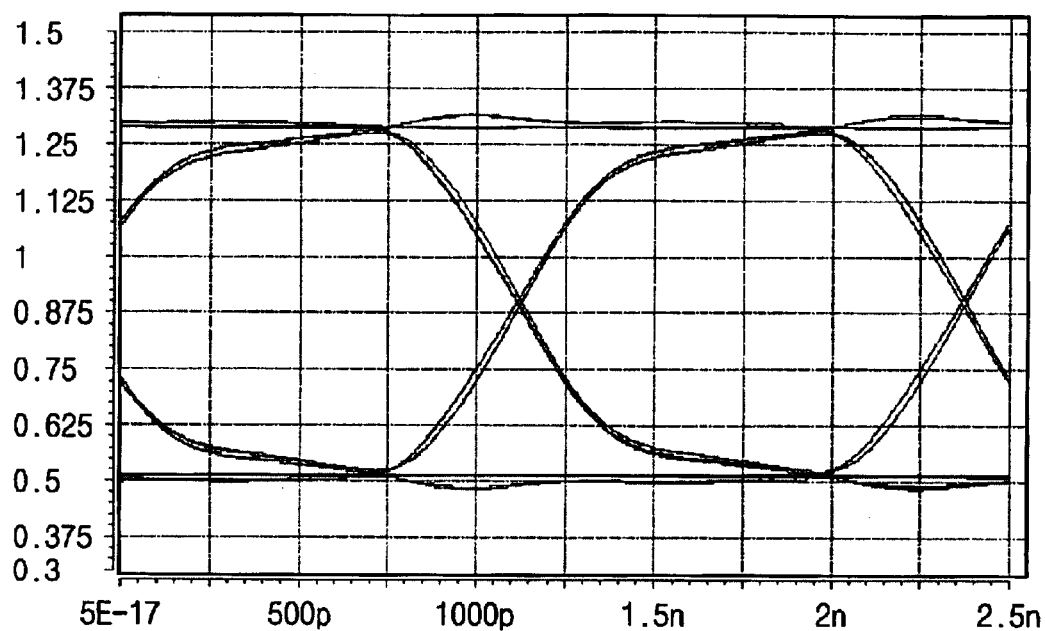
FIGS. 8A to 8D are other eye waveform diagrams of data that is transmitted from a memory system according to an exemplary embodiment of the present invention.
Figure 8B:
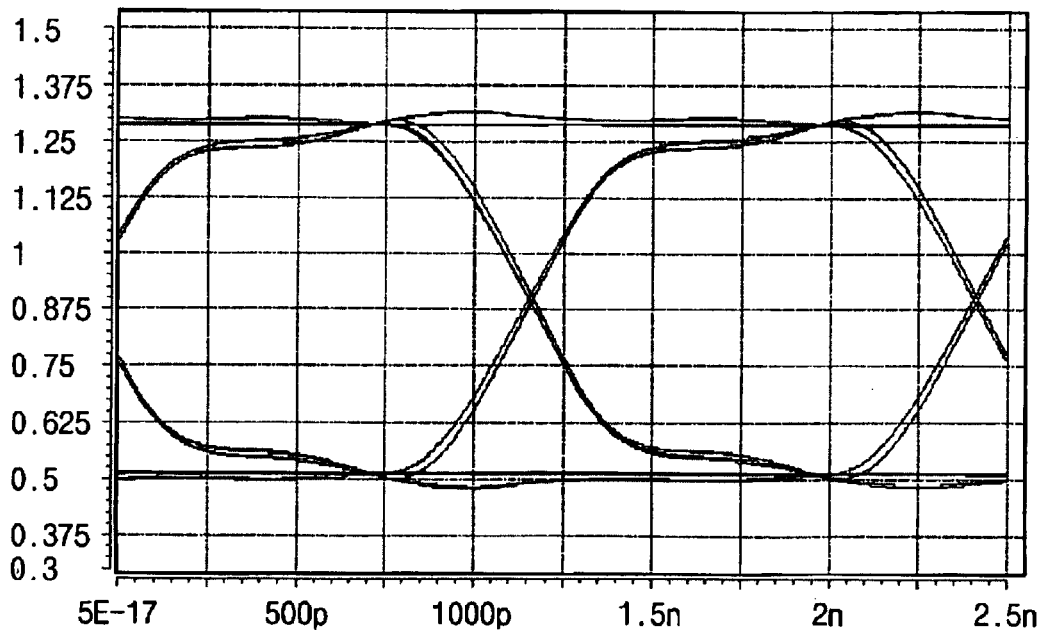
Figure 8C:
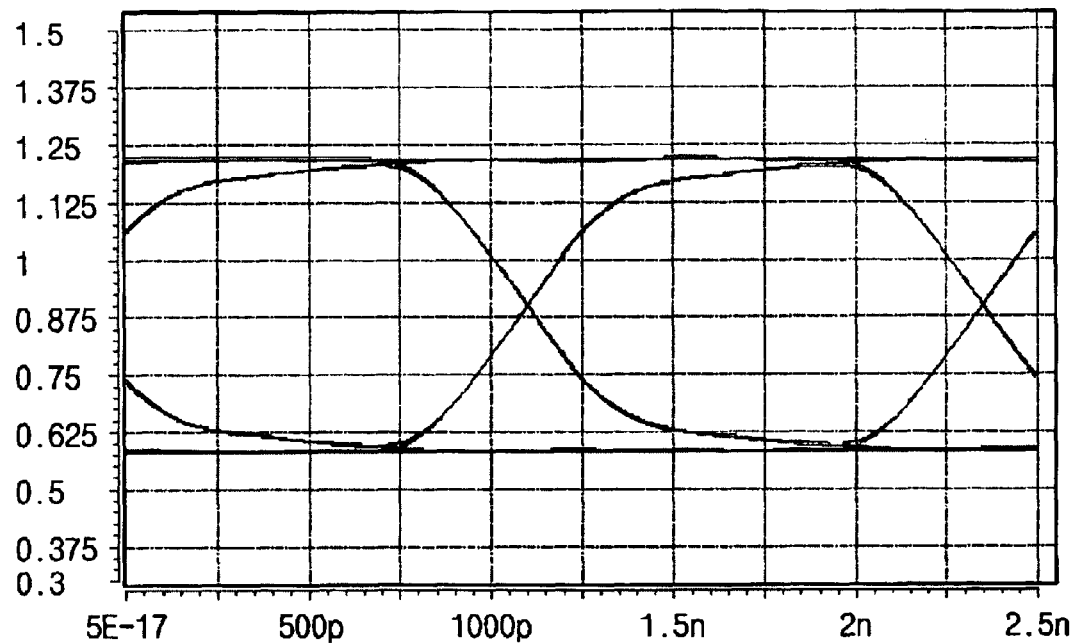
Figure 8D:
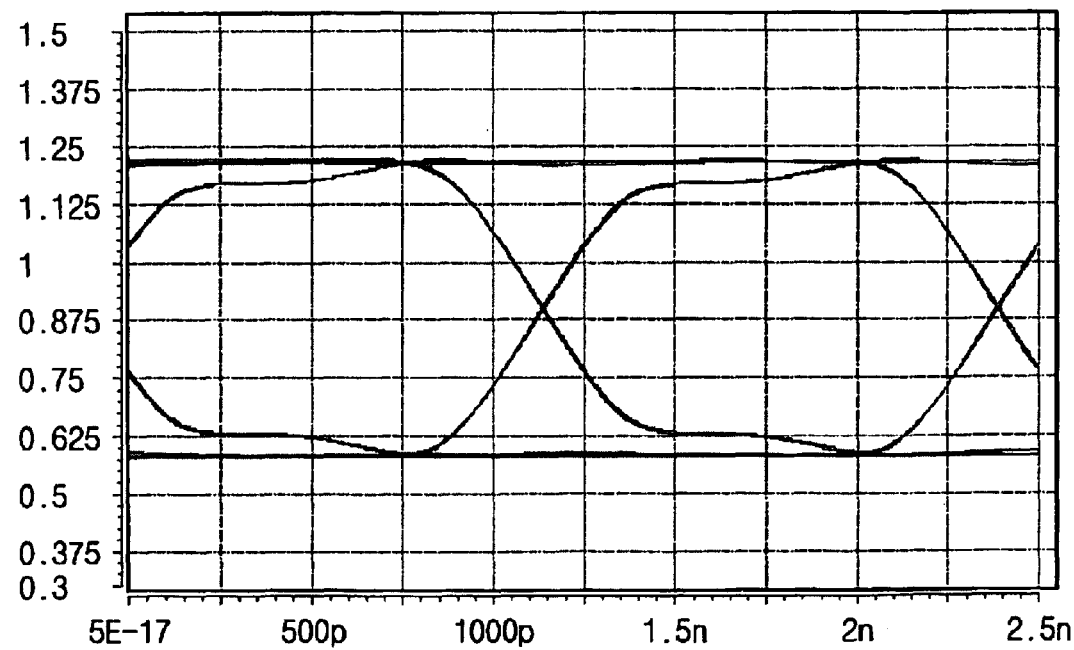

In FIGS. 8A and 8B, waveforms are obtained using a memory system similar to that illustrated in FIG. 5A and that satisfies the aforementioned conditions. In particular, while a termination circuit 203 of a chipset 110 does not operate, the termination circuits 212 and 223 of the first and second memory modules 120 and 130 operate. In FIGS. 8C and 8D, waveforms are obtained using a memory system similar to that illustrated in FIG. 6A or 6B and that satisfies the aforementioned conditions. During a read operation, the termination circuit 203 of the chipset 110 and a termination circuit of an unselected memory device are activated so as to act as termination resistors of a memory bus 170. At this time, a termination circuit of a selected memory device is inactivated.

As set forth above, a high-speed bus operation characteristic may be improved by reducing impedance mismatching at a branch point. This is achieved by using line impedance of a memory bus and stub impedance of a memory module, and by matching ends of the memory bus using termination circuits included in memory devices and a chipset.

The invention has been described using exemplary embodiments of the present invention. However, it is to be understood that the scope of the invention is not limited to the disclosed exemplary embodiments. On the contrary, the exemplary embodiments are intended to cover various modifications and similar arrangements. The scope of the claims, therefore, should be accorded the broadest interpretation so as to encompass all such modifications and similar arrangements.

What is claimed is:

1. A memory system, comprising:
   a circuit board;
   a chipset mounted on the circuit board;
   a plurality of memory module connectors mounted on the circuit board;
   a plurality of memory modules, each of the plurality of memory modules individually receivable in each of the plurality of memory module connectors; and
   a bus connected to the chipset and the plurality of memory module connectors, the plurality of memory module connectors connected to the bus at a single branch point,
   wherein each of the plurality of memory modules includes at least one memory device connected to the bus via a stub line and a stub resistor, and wherein an impedance of the bus is less than an impedance of the stub lines.

2. The memory system according to claim 1, wherein the stub lines have substantially equal impedances.

3. The memory system according to claim 1, wherein each memory device includes a termination circuit connected to a corresponding stub line.

4. The memory system according to claim 3, wherein the termination circuits selectively operate in response to a mode of operation of the memory system.

5. The memory system according to claim 4, wherein the termination circuits function as a termination resistor during a write mode of operation.

6. The memory system according to claim 4, wherein any one of the termination circuits function as a termination resistor during a write mode of operation.

7. The memory system according to claim 1, wherein the chipset comprises a termination circuit.

8. The memory system according to claim 7, wherein the termination circuit of the chipset operates during a read mode operation of the memory.

9. The memory system according to claim 1, wherein a ratio of the impedance of the bus to the impedance of at least one of the plurality of stub lines is 3:4.

10. The memory system according to claim 9, wherein each stub resistor has half the impedance of a corresponding stub line.

11. A memory system, comprising:
    a chipset having a transceiver and a termination circuit commonly connected to a bus;
    a plurality of memory module connectors commonly connected to the bus;
    a memory module insertable into one of the plurality of memory module connectors and having a transceiver and a termination circuit commonly connected to the bus via a stub line and a stub resistor; and
    another memory module insertable into one of the plurality of memory module connectors and having a transceiver and a termination circuit commonly connected to the bus via another stub line and another stub resistor,
    wherein an impedance of the bus is less than that of each of the stub lines, and the stub resistors have half the impedance of each of the stub lines.

12. The memory system according to claim 11, wherein the memory modules are commonly connected to one branch point of the bus.

13. The memory system according to claim 12, wherein the stub lines have substantially equal impedances.

14. The memory system according to claim 12, wherein the termination circuits of the memory modules selectively operate according to a mode of operation of the memory system.

15. The memory system according to claim 14, wherein the termination circuits of the memory modules function as a termination resistor during a write mode of operation.

16. The memory system according to claim 14, wherein either one of the termination circuits of the memory modules functions as a termination resistor during a write mode of operation.

17. The memory system according to claim 14, wherein the termination circuit of the chipset operates during a read mode of operation.

18. The memory system according to claim 14, wherein a ratio of the impedance of the bus to the impedance of each of the stub lines is 3:4.

19. A circuit associated with a memory system, comprising:
    a bus line having an impedance value; and
    at least one stub line connected to the bus line via a stub resistor, the at least one stub line having an impedance value greater than the impedance value of the bus line, the stub resistor having an impedance value up to about one half the impedance value of the at least one stub line.

20. The circuit according to claim 19, wherein two stub lines are connected to the bus line via a corresponding stub resistor at a single branch point, the two stub lines each having an impedance value greater than the impedance value of the bus line.

21. The circuit according to claim 19, wherein the impedance values of the two stub lines are substantially equal.

22. A memory system, comprising:
    a bus line;
    a chipset operationally connected to the bus line and including a termination circuit;
    at least one memory module operationally connected to the bus line via a stub line wherein an impedance of the bus line is less than an impedance of the stub line, and the at least one memory module including a termination circuit,
    wherein the termination circuits in the chipset and the at least one memory module selectively operate in response to a mode of operation of the memory system.

23. The memory system according to claim 22, wherein the termination circuit of the chipset is enabled during a read mode operation.

24. The memory system according to claim 22, wherein the termination circuit of the memory module is enabled during a write mode operation.

25. The memory system according to claim 24, further comprising an additional memory module operationally connected to the bus line, the additional memory module operable in the same manner as the at least one memory module.

26. A memory system, comprising:

a chipset mounted on a circuit board;

a plurality of memory modules, each of the plurality of memory modules individually receivable in a corresponding one of a plurality of memory module connectors; and a bus connected to the chipset, the plurality of memory module connectors connected to the bus at a single branch point, wherein each of the plurality of memory modules includes at least one memory device connected to the bus via a stub line and a stub resistor, wherein an impedance of the bus is less than an impedance of the stub line, and each memory device includes a termination circuit connected to a corresponding stub line, and the termination circuits selectively operate in response to a mode of operation of the memory system.

* * * * *